(12) United States Patent  
Martinson et al.

(10) Patent No.: US 9,382,618 B2  
(45) Date of Patent: Jul. 5, 2016

(54) OXYGEN-FREE ATOMIC LAYER DEPOSITION OF INDIUM SULFIDE

(71) Applicant: UCHICAGO ARGONNE, LLC, Chicago, IL (US)

(72) Inventors: Alex B. Martinson, Naperville, IL (US); Adam S. Hock, Chicago, IL (US); Robert McCarthy, Chicago, IL (US); Matthew S. Weimer, Chicago, IL (US)

(73) Assignee: UChicago Argnonne, LLC, Chicago, IL (US)

( * ) Notice: Subject to any disclaimer, the term of this patent is extended or adjusted under 35 U.S.C. 154(b) by 140 days.

(21) Appl. No.: 14/335,745

(22) Filed: Jul. 18, 2014

(65) Prior Publication Data

US 2016/0017485 A1  Jan. 21, 2016

(51) Int. Cl.  
C23C 16/30 (2006.01)  
C23C 16/455 (2006.01)

(52) U.S. Cl.  
CPC .......... C23C 16/305 (2013.01); C23C 16/45553 (2013.01)

(58) Field of Classification Search  
CPC .............................. C23C 16/301; C23C 16/305  
See application file for complete search history.

(56) References Cited

U.S. PATENT DOCUMENTS

| | | | | |
|---|---|---|---|---|
| 6,228,794 B1 * | 5/2001 | Jordan | ................... | B01J 31/146 502/150 |
| 7,557,229 B2 | 7/2009 | Gordon et al. | | |
| 2006/0141155 A1 * | 6/2006 | Gordon | ................. | C07C 257/14 427/255.19 |
| 2009/0180314 A1 * | 7/2009 | Liu | .................... | G11C 11/5678 365/163 |
| 2009/0304924 A1 * | 12/2009 | Gadgil | ................ | C23C 16/4412 427/255.5 |
| 2010/0187982 A1 * | 7/2010 | Hsu | ...................... | H01L 51/5088 313/504 |
| 2010/0300524 A1 * | 12/2010 | Martinson | ............. | C23C 16/305 136/256 |
| 2013/0017322 A1 * | 1/2013 | Wu | ...................... | C23C 18/1204 427/126.1 |
| 2013/0213478 A1 * | 8/2013 | Munteanu | ........... | H01L 21/2254 136/264 |
| 2015/0041873 A1 * | 2/2015 | Karda | ................ | H01L 21/28291 257/295 |
| 2015/0170914 A1 * | 6/2015 | Haukka | ................ | H01L 21/0262 438/478 |
| 2015/0295105 A1 * | 10/2015 | Happ | ................... | H01L 31/0322 136/256 |

OTHER PUBLICATIONS

Yousfi, E.B., et al., "Atomic layer deposition of zinc oxide and indium sulfide layers for Cu(In,Ga)Se2 thin-film solar cells". Thin Solid Films 387 (2001) 29-32.*

Donsanti, F., et al., "Atomic Layer Deposition of Indium Sulfide Layers for Copper Indium Gallium Diselenide Solar Cells". Mat. Res. Soc. Symp. Proc. vol. 668, 2001, Symposium H poster H8.20, pp. 1-8.*

(Continued)

Primary Examiner — Bret Chen  
(74) Attorney, Agent, or Firm — Foley & Lardner LLP

(57) ABSTRACT

A method for synthesizing an In(III) N,N'-diisopropylacetamidinate precursor including cooling a mixture comprised of diisopropylcarbodiimide and diethyl ether to approximately −30° C., adding methyllithium drop-wise into the mixture, allowing the mixture to warm to room temperature, adding indium(III) chloride as a solid to the mixture to produce a white solid, dissolving the white solid in pentane to form a clear and colorless solution, filtering the mixture over a celite plug, and evaporating the solution under reduced pressure to obtain a solid In(III) N,N'-diisopropylacetamidinate precursor. This precursor has been further used to develop a novel atomic layer deposition technique for indium sulfide by dosing a reactor with the precursor, purging with nitrogen, dosing with dilute hydrogen sulfide, purging again with nitrogen, and repeating these steps to increase growth.

14 Claims, 17 Drawing Sheets

(56) References Cited

OTHER PUBLICATIONS

Naghavi, N., et al., "High-Efficiency Copper Indium Gallium Diselenide (CIGS) Solar Cells with Indium Sulfide Buffer Layers Deposited by Atomic Layer Chemical Vapor Deposition (ALCVD)". Progress in Photovoltaics: Research and Applications, 2003; 11:437-443.*

McCarthy, et al., "Oxygen-Free Atomic Layer deopsition of Indium Sulfide," ACS Applied Materials & Interfaces, 2014, vol. 6, pp. 12137-12145.

* cited by examiner

OXYGEN-FREE ATOMIC LAYER DEPOSITION OF INDIUM SULFIDE

The United States Government has rights in the invention described herein pursuant to Contract No. DE-AC02-06CH11357 between the United States Department of Energy and UChicago Argonne, LLC, as operator of Argonne National Laboratory.

FIELD OF THE INVENTION

The present invention relates generally to the field of atomic layer deposition of indium sulfide. More specifically, the present invention relates to a method of atomic layer deposition of indium sulfide films using a synthesized indium precursor and hydrogen sulfide.

BACKGROUND

This section is intended to provide a background or context to the invention recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Indium sulfide has long attracted attention as one of just a few simple sulfides with good stability, moderate band gap, and high carrier mobility. $In_2S_3$ has shown potential, in particular, in the photovoltaic industry as a buffer layer in thin film devices, replacing potentially toxic CdS layers. Indium (III) is also a principal component in some of the most efficient thin film chalcogenide PV alloys including $CuInS_2$ and $Cu(In,Ga)(S,Se)_2$. In addition to these supporting roles, $In_2S_3$ may serve as a well-behaved and photoactive absorber layer. Substitutionally doped alloys of $In_2S_3$ have further been identified as impurity-band absorbers with nearly ideal energy level separation for solar energy applications. A variety of deposition methods exist for $In_2S_3$ including chemical bath deposition, physical vapor deposition, ion layer gas reaction, sputtering, and atomic layer deposition (ALD). ALD is one of the most promising routes to optoelectronic materials as it enables digital control and conformal growth, sophisticated doping opportunities, as well as pinhole-free films of high density.

The self-limiting surface chemistries that constitute a well-defined ALD process afford unique synthetic control over interfaces, stoichiometry, and crystalline phase. Furthermore, many low-temperature ALD (<200° C.) processes have been identified that enable high quality materials growth in applications with limited thermal stability including flexible substrates or multilayers prone to diffusion. An important requirement for achieving electronic-quality materials through low-temperature ALD is the identification of a metal precursor with clean surface chemistry so as to exclude deleterious impurities. Though several reports of the ALD of $In_2S_3$ have been published, the processes leave something to be desired. Initial work with $InCl_3$ showed good growth rates of 1.4 Å/cycle and lead to polycrystalline films. However, a volatilization temperature of at least 300° C. as required for $InCl_3$ necessitates the use of more complex tooling including high temperature and chemically resistant valves. Composition analysis also revealed that optimized growth resulted in 3% Cl contamination, a value that is well beyond that acceptable for many applications. In an attempt to bypass high temperature halide-based processes, which produce strongly acidic byproducts known to etch films and damage tools, several reports have focused on indium (III) acetylacetonate $(In(acac)_3)$. This precursor allows for significantly lower growth temperatures and halide-free films when dosed alternately with $H_2S$. However, a wide range of thin film properties result including a direct band gap of ~2.8 eV, which is consistent with significant oxygen incorporation. The precursor is further limited by a modest thermal stability threshold reported to be 150° C. The resulting films exhibit non-ideal S/In ratios (1.42) and high carbon levels (3.7-5.1%), while the process suffers from low precursor volatility, and modest self-limiting growth rates −0.35 Å/cycle with demonstrated self-limiting behavior, though up to 0.7 Å/cycle has been reported—that all leave significant room for improvement. Until now there have been no reports of $In_2S_3$ thin films grown by ALD with an impurity level lower than 3%.

A need exists for improved technology, including technology that may address the above problems, namely by providing a method of oxygen-free atomic layer deposition of indium sulfide using a synthesized indium precursor and hydrogen sulfide.

SUMMARY

One embodiment of the invention relates to a method for synthesizing an In(III) N,N'-diisopropylacetamidinate precursor including cooling a mixture comprised of diisopropylcarbodiimide and diethyl ether to approximately −30° C., adding methyllithium drop-wise into the mixture, allowing the mixture to warm to room temperature, adding indium(III) chloride as a solid to the mixture to produce a white solid, dissolving the white solid in pentane to form a clear and colorless solution, and evaporating the solution under reduced pressure to obtain a solid In(III) N,N'-diisopropylacetamidinate precursor.

Another embodiment of the invention relates to a method of oxygen-free atomic layer deposition of indium sulfide on a hot-wall atomic layer deposition tool. The method includes continuously pumping an ultra-high purity nitrogen carrier gas through the tool, delivering a solid In(III) N,N'-diisopropylacetamidinate precursor under its own vapor pressure without the nitrogen carrier gas to the tool, adding a 1% dilute hydrogen sulfide mixture to the tool, and conducting at least one growth cycle. One growth cycle includes the following sequential steps: a 4 second In(III) N,N'-diisopropylacetamidinate precursor dose, a 25 second nitrogen carrier gas purge, a 0.3 second hydrogen sulfide dose, and a 25 second nitrogen carrier gas purge. Deposition can also be performed with 4% dilute hydrogen sulfide. Purge times as low as 5 s (for temperatures of 200° C. or higher) can be used. Lower temperatures require longer purge times to avoid excess reaction with physisorbed species Yet another embodiment of the invention relates to an indium sulfide film produced by continuously pumping an ultra-high purity nitrogen carrier gas through the tool, delivering a solid In(III) N,N'-diisopropylacetamidinate precursor under its own vapor pressure without the nitrogen carrier gas to the tool, adding a 1% dilute hydrogen sulfide mixture to the tool, and conducting at least one growth cycle. One growth cycle includes the following sequential steps: a 4 second In(III) N,N'-diisopropylacetamidinate precursor dose, a 25 second nitrogen carrier gas purge, a 0.3 second hydrogen sulfide dose, and a 25 second nitrogen carrier gas purge. The indium sulfide film is free from halide and oxygen impurities. Deposition can also be performed with 4% dilute hydrogen sulfide, and purge times as low as 5 s (for temperatures of 200° C. or higher) can be used. Lower temperatures require longer purge times to avoid excess reaction with physisorbed species.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The disclosure will become more fully understood from the following detailed description, taken in conjunction with the accompanying figures, in which:

FIG. 3 (b) is a graph illustrating a high-resolution trace reveals abrupt mass changes coincident with precursor exposure.

FIG. 13(b) is a graph illustrating growth rate versus purge length at 200° C. for indium amidinate (sequence 4s/Xs/0.3s/25s).

DETAILED DESCRIPTION

Figure 1:
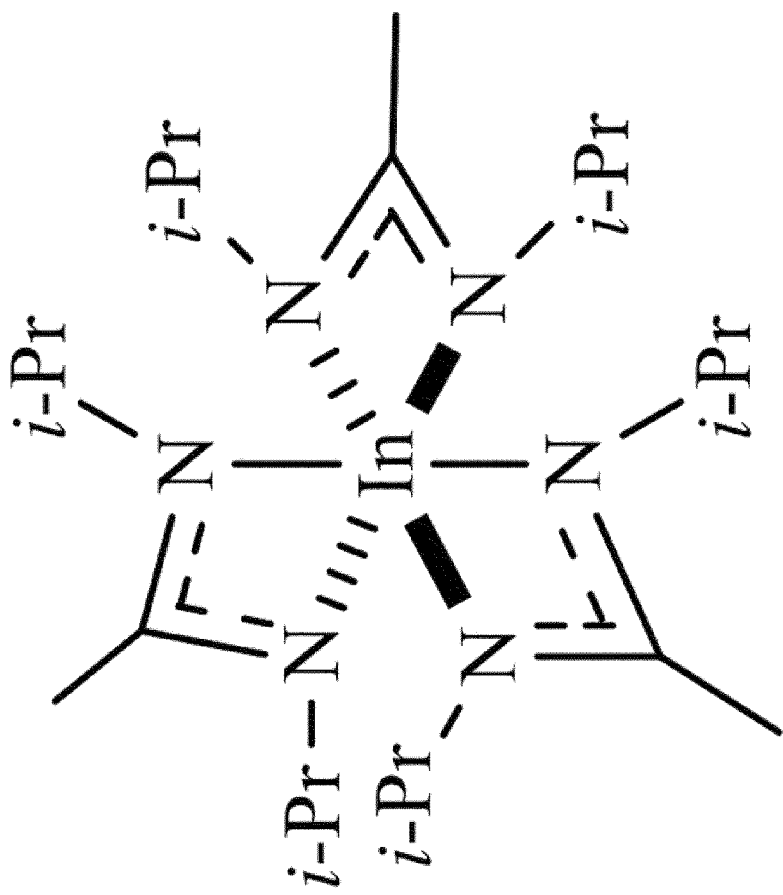
FIG. 1 illustrates the molecular structure of In(III) N,N'-diisopropylacetamidinate.

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

Referring, in general, to the figures, atomic layer deposition (ALD) of indium sulfide ($In_2S_3$) films was achieved using a newly synthesized indium precursor and hydrogen sulfide. Dense and adherent thin films free from halide and oxygen impurities were obtained. Self-limiting half-reactions were demonstrated at temperatures up to 200° C., where oriented crystalline thin films are obtained without further annealing. Films grown at 175° C. and higher were crystalline as-deposited, with crystallinity and orientation improving with temperature. Low temperature growth up to 0.89 Å/cycle was observed at 150° C., while higher growth temperatures gradually reduced the per-cycle growth down to 0.20 Å/cycle at 225° C. Rutherford backscattering spectroscopy (RBS) together with depth-profiling Auger electron spectroscopy revealed a S/In ratio of 1.5 with no detectable carbon, nitrogen, halogen, or oxygen impurities. The resistivity of thin films prior to air exposure decreased with increasing deposition temperature, ranging from ~10 to 0.1 ohm-cm. Hall measurements revealed n-type conductivity due to free electron concentrations from approximately $10^{17}$-$10^{19}$ $cm^{-3}$ and mobilities from approximately 0.1 to 10 $cm^2/(V \cdot s)$. The digital synthesis of $In_2S_3$ via ALD at temperatures up to 225° C. may allow high quality thin films to be leveraged in optoelectronic devices including photovoltaic absorbers, buffer layers, and intermediate band materials.

All chemical manipulations were carried out using standard Schlenk and glove box techniques in a nitrogen atmosphere. Pentane and diethyl ether were dried by passing through two columns (one neutral alumina and one copper (II) oxide-Q5 column), stored over 4 Å molecular sieves and tested periodically with sodium benzophenone ketyl. Celite and molecular sieves were kept above 150° C. for a minimum of five days and were heated to 160° C. under reduced pressure overnight prior to use. N,N'-diisopropylcarbodiimide (99%) and $In(Cl)_3$ (98%) were used as received from Sigma Aldrich, while methyl lithium (1.57 M in diethyl ether) was used as received from Alfa Aesar. $^1H$ (300 MHz) and $^{13}C$ (75 MHz) NMR spectra were recorded on a Bruker Avance 300 MHz instrument at ambient temperature. Chemical shifts were referenced to internal protio solvent peaks. NMR solvent was purchased from Cambridge Isotopes and dried over 4 Å molecular sieves for a minimum of 48 hours prior to use.

Synthesis of In(III) N,N'-diisopropylacetamidinate [$In(amd)_3$]

A 250 ml round bottom flask was charged with a Teflon stir bar, 9.0 ml (57.5 mmole) of diisopropylcarbodiimide, and 150 ml of diethyl ether. The mixture was cooled to −30° C. then 36 ml (57.4 mmole) of 1.57 M MeLi was added dropwise. After allowing the reaction to warm to room temperature and stir for a total time of ca. two hours, 4.212 g of $InCl_3$ (19.04 mmole) was slowly added as a solid. The white, cloudy reaction was allowed to proceed overnight at room temperature (ca. 16 hrs) then diethyl ether was removed under reduced pressure (approximately 0.1 Torr). The resulting white solid was dissolved in 100 ml of pentane, filtered through a celite plug, and the plug washed (3×20 ml pentane). The pentane was evaporated from the clear, and colorless solution under reduced pressure (approximately 0.1 Torr) at room temperature to produce 9.371 g (17.40 mmole) of a white flakey solid in a 91% yield. This procedure produces pure $In(amd)_3$ (by $^1H$ NMR spectroscopy, shown in the supporting information FIGS. 11 and 12) from pure starting material. However, further purification of $In(amd)_3$ is possible by dissolving the solid isolated from filtration in a minimum amount of pentane and allowing the mixture to cool to −30° C. Further purification can be performed by sublimation of crude $In(amd)_3$ at 150° C. and 20 mTorr. A melting point was not observed up to 320° C., when the material turned brown (decomposition). The assignments are as follows: $^1H$-NMR (300 MHz, $C_6D_6$) spectrum peaks (FIG. 11): δ 3.63 (6H, $NCH(CH_3)_2$, septet), 1.62 (9H, amidinate $CH_3$, singlet), 1.35 (18H, $NCH(CH_3)_2$, doublet) and 1.18 (18H, CCH $(CH_3)_2$, doublet). $^{13}C$-NMR (75.4 MHz, $C_6D_6$, ppm) spectrum peaks (FIG. 12): δ 164.56 ($N_2CCH_3$), 47.44 ($CCH_3$), 26.43 and 25.17 ($NCCH(CH_3)_2$), 11.46 ($NCCH(CH_3)_2$).

$In_2S_3$ films were grown in a commercial hot-wall ALD tool (Savannah 200, Cambridge NanoTech) adapted for compatibility with $H_2S$. A constant 10 sccm stream of ultra-high purity nitrogen carrier/purge gas is continuously pumped through the tool resulting in a base pressure of 0.25 Torr. $In(amd)_3$ was delivered under its own vapor pressure (without nitrogen assist) from a 50 $cm^3$ stainless steel cylinder heated to 190° C. A dilute hydrogen sulfide mixture (1% in $N_2$, Matheson Tri-Gas) was stepped down to 500 Torr through a two-stage regulator before flowing through a 300 μm pinhole just prior to the pneumatic ALD valve. One growth cycle consists of four sequential steps: a 4 s $In(amd)_3$ dose (~0.04 Torr partial pressure), 25 s purge, a 0.3 s $H_2S$ dose (~0.45 Torr partial pressure), and 25 s purge. This sequence, denoted 4-25-0.3-25, was repeated throughout unless otherwise noted. Deposition can also be performed with 4% dilute hydrogen sulfide (~0.45 Torr partial pressure still, but only using a 0.1s dose), and purge times as low as 5s (for temperatures of 200° C. or higher) can be used. Lower temperatures require longer purge times to avoid excess reaction with physisorbed species. In other words, the dosage times (i.e. time required to deliver a saturating dose) and purge times may be changed, depending on the particular ALD tool utilized, the reactor temperature or the concentration of the precursor or hydrogen sulfide. For example, the nitrogen purge time may be from 5 to 25 seconds, depending on the reactor temperature. The possibility of ALD processes for $In_2S_3$ that utilize several commercially available In precursors was also explored under similar conditions. These precursors and their required volatilization temperature in our tool are cyclopentadienyl indium (99.99% from Strem, 70° C.), trimethylindium (98+% from Strem, 45° C.), tris(2,2,6,6-tetramethyl-3, 5-heptanedionatio)indium(III) (99% from Strem, >190° C.), indium (III) acetylacetonate (99.99% from Sigma-Aldrich, >190° C.), and an indium tris(guanidinate) (synthesized using a previously reported method from the literature, 160° C.).

In other embodiments, one or more of the features described in this paragraph may be substituted for one or more of the features discussed above in the method of oxygen-free atomic layer deposition of indium sulfide on an atomic layer deposition tool. A different ALD tool may be used, such as a warm-wall ALD tool. ALD may be performed with stop-flow operation, as opposed to continuously pumping nitrogen carrier/purge gas through the tool. Instead of delivering $In(amd)_3$ under its own vapor pressure (without nitrogen assist), the precursor may be delivered by gas through a bubbler or the like.

In one embodiment, oxygen-free atomic layer deposition of indium sulfide on the atomic layer deposition tool occurs at temperatures ranging from 125° C. to 240° C.

Quartz crystal microbalance (QCM) measurements were performed with a modified reactor lid wherein mass changes may be monitored in situ directly adjacent to and simultaneous to ex situ film growth as previously described. Films for ex situ analysis were grown on Si (100) substrates with native oxide as well as fused quartz. Prior to growth, substrates were subjected to ten minutes of acetone sonication, rinse, ten minutes of isopropanol sonication, rinse, a $N_2$ blast dry, and ten minutes in the tool to equilibrate temperature. Nanoscale film morphology was determined via scanning electron microscopy (SEM). The crystallinity and crystalline orientation of $In_2S_3$ films on fused quartz were determined by X-ray diffraction (XRD, Cu Kα radiation, Rigaku Miniflex Plus). Absorption studies were performed using a Cary 5000 UV-Vis-NIR from Agilent Technologies including an integrating sphere to correct for sample reflectivity. The majority carrier type, composition, and mobility were investigated with a Hall measurement system (HMS-3000, Ecopia) at room temperature. The absolute film composition and impurity incorporation was determined by Rutherford backscattering spectroscopy (RBS) and depth-profiling Auger spectroscopy, both performed by Evans Analytical. Film thickness, density, and roughness were determined by x-ray reflectivity (Philips X'Pert Pro MRD diffractometer, Cu Kα radiation).

With the newly synthesized precursor and hydrogen sulfide as the S source the inventors obtained amorphous or polycrystalline thin films with a growth rate up to 0.89 Å/cycle. The novel metal organic precursor was exceedingly stable, up to ~300° C., yet exhibited good reactivity with —SH terminated surfaces as low as 125° C. Films grown at 200° C. exhibited precisely the stoichiometry of $In_2S_3$ and are largely free from impurities. Oriented crystalline films were obtained as deposited at growth temperatures between 175-225° C.

that exhibited an optical band gap near the expected value of ~2.0 eV. A moderate intrinsic n-type carrier concentration ~$10^{18}$ and majority carrier (electron) mobility in excess of 1 $cm^2/(V \cdot s)$ further underscored the potential utility of the ALD process described above in future optoelectronic applications.

Commercially Available Indium Precursors

Prior to the synthesis of $In(amd)_3$, a number of commercially available In precursors were explored. ALD processes for each were found unsatisfactory for the reasons summarized briefly below. Trimethylindium is a high volatility precursor that has been utilized for ALD growth of $In_2O_3$ using $H_2O$ with limited success and, more recently with $N_2O$. Unfortunately, no growth was observed when pulsed sequentially with $H_2S$ between 150-250° C. Cyclopentadienyl indium, which has previously been used with ozone for the ALD of $In_2O_3$, also failed to produce sustainable growth of $In_2S_3$ in concert with $H_2S$. Cyclopentadienyl ligands are often difficult to remove and in this case, direct evidence is available from mechanistic studies of ALD with sequential $H_2O$ and $O_2$ exposure. Other In precursors failed primarily because only modest vapor pressure and/or evaporation rates were achievable at temperatures less than that at which the precursor decomposes. $In(acac)_3$ has been successfully delivered with nitrogen assist but its propensity for thermal decomposition has been previously noted. Saturating doses could not be readily achieved without nitrogen assist near the decomposition temperature of 150° C. Tris(2,2,6,6-tetramethyl-3,5-heptanedionato)indium(III) [$In(TMHD)_3$] was also explored, but was, as expected, found to be less volatile than $In(acac)_3$. An indium guanidinate, $In[(N^iPr)_2CNMe_2]_3$, was also synthesized based on previous reports. Although ALD growth was observed, sufficient precursor delivery was not achieved below 110° C., the temperature at which this precursor decomposes significantly.

Newly Synthesized $In(amd)_3$ Precursor

In contrast, to the commercially available In precursors, the synthesized $In(amd)_3$ precursor provides ample precursor delivery without nitrogen assist at 190° C., below the precursor decomposition temperature (>300° C.) and standard ALD valve limit (200° C.). The molecular structure of the In(III) precursor described herein is shown in FIG. 1.

Figure 11:
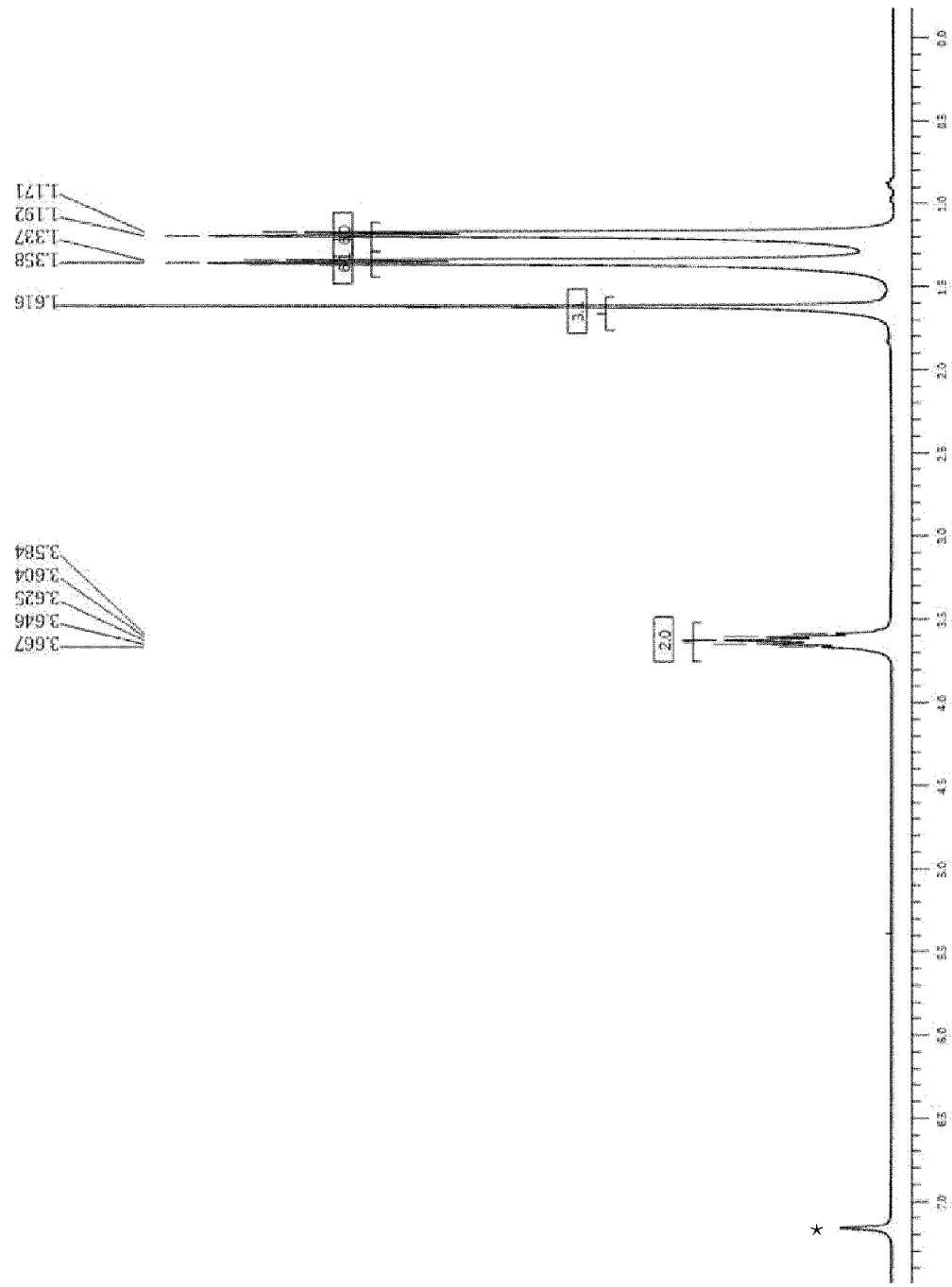
FIG. 11 is an $^1H$ NMR spectrum of purified $In(amd)_3$ taken on a Bruker Avance at 300 MHz. Peaks referenced to internal protio solvent peak ($C_6D_5H$; 7.15 ppm; marked with an *).
Figure 12:
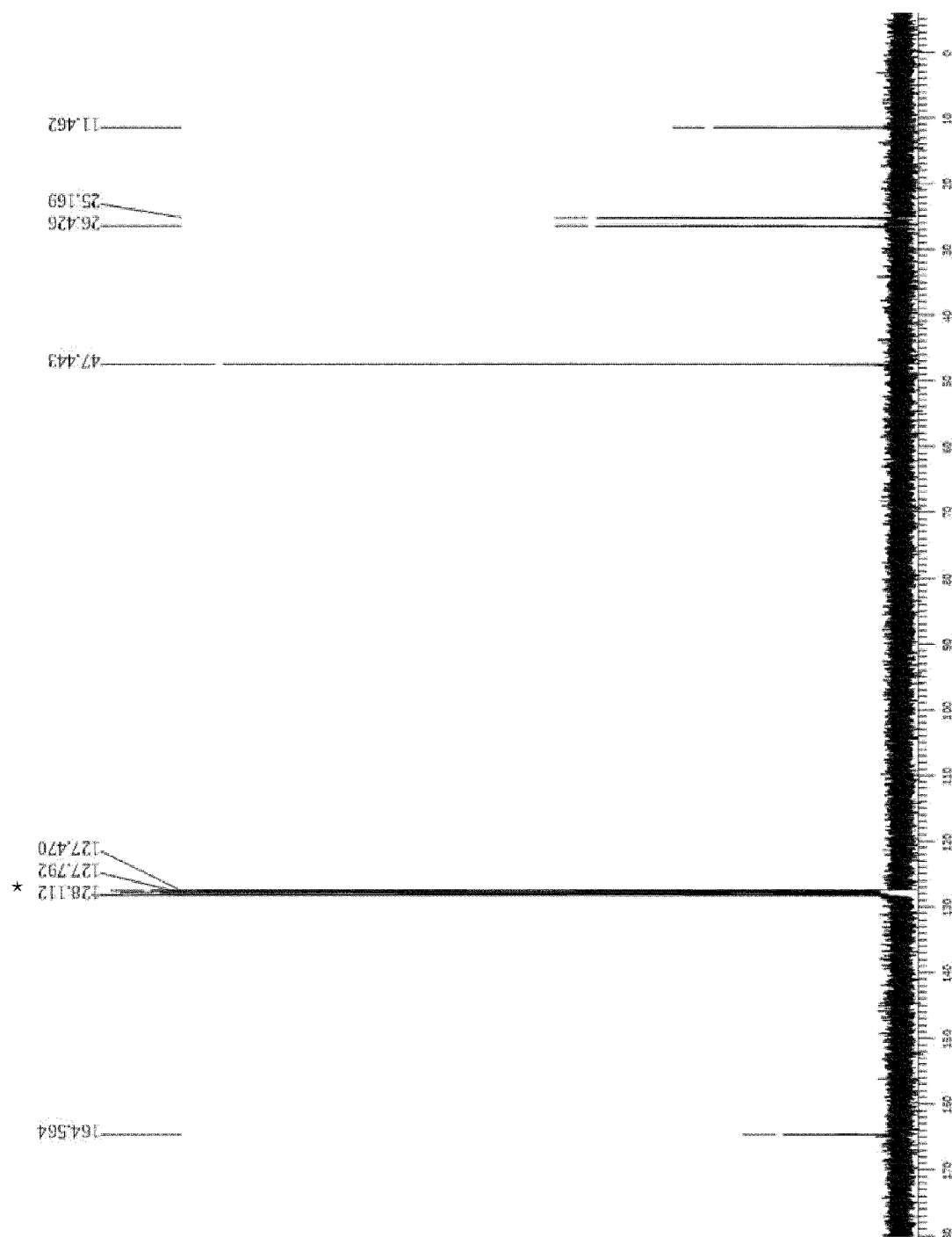
FIG. 12 is a $^{13}C$ NMR spectrum of $In(amd)_3$ taken on a Bruker Avance at 75.4 MHz. Peaks referenced to internal $^{13}C$ peak ($C_6D_6$; 128.0 ppm; marked with an *).

Facile synthesis of $In(amd)_3$ is conveniently performed on the multigram scale to produce off white solid with minimum purification. First, synthesis of the lithium salt of the desired acetamidinate from methyl lithium and the carbodiimide is performed, followed by salt metathesis of that reaction mixture with indium(III) chloride. While there is not a large amount of literature on the synthesis or reactivity of amidinate compounds of indium(III), in the prior art, the tris-N,N'-dicyclohexylacetimidinate of indium was synthesized and two sets of peaks for the three acetimidinate ligands in the room temperature $^1H$ NMR have been observed. This is attributed to the steric hindrance of the pseudo-octahedral (trigonal prismatic) configuration of the trisamidinate compound causing a fast exchange of the metal coordination environment. The isopropyl groups in the novel $In(amd)_3$ also show the same amide/imine inequivalent environment at room temperature, where two equivalent doublets are observed at 1.35 and 1.18 ppm (FIG. 11). Thermal investigation of this product shows that the compound cleanly sublimes at 150° C. and 20 mTorr and exhibits stability up to ca. 320° C. in a sealed vessel, when it turned a dark brown and became $^1H$ NMR silent. The large temperature span between sublimation temperature (150° C.) and decomposition temperature (>300° C.) make $In(amd)_3$ unique among In(III) precursors for its utility in chemical vapor deposition.

Figures 2A, 2B:
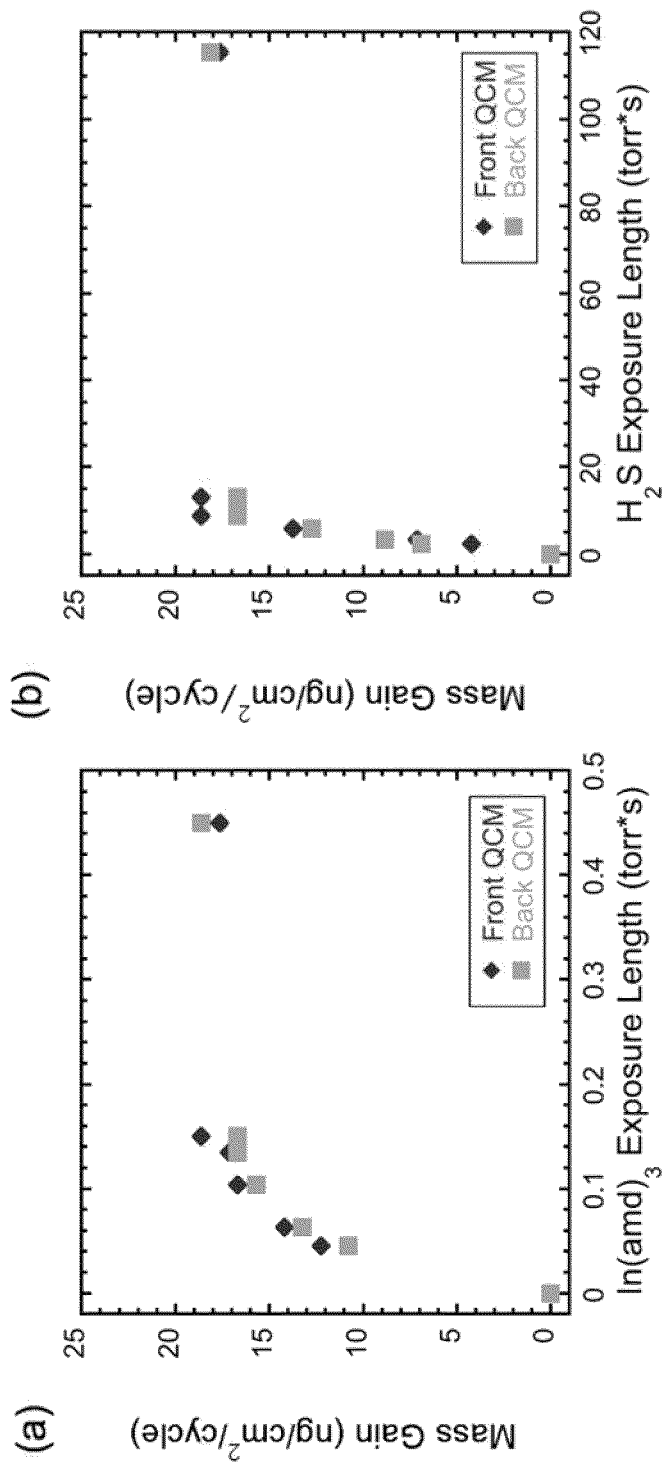
FIG. 2(a) is a graph illustrating mass gain as function of precursor exposure time for $In(amd)_3$ (x-25-0.3-25) where x=0.5, 1, 2, 3, 4, and 12 s. The 12 s $In(amd)_3$ pulse is achieved through 3 consecutive 4 s doses separated by 50 s in order to allow sufficient time for vapor equilibration over the solid precursor.
FIG. 2(b) is a graph illustrating mass gain as function of precursor exposure time for $H_2S$ (4-25-y-25) where y=0.05, 0.1, 0.2, 0.3, 0.4, and 0.5 s. The 12 s $In(amd)_3$ pulse is achieved through 3 consecutive 4 s doses separated by 50 s in order to allow sufficient time for vapor equilibration over the solid precursor.

Having established a large window of precursor stability, the self-limiting nature of each half-reaction was investigated at a 200° C. reactor temperature with the $In(amd)_3$ source held at 190° C. The total exposure of $In(amd)_3$ and $H_2S$ was varied by systematically increasing the length of time to which the reaction chamber was open to each precursor source. Under the conditions employed, a relatively constant partial pressure (~0.04 Torr) was produced for the duration of the $In(amd)_3$ pulse. The growth rate is reported as the average mass per $cm^2$ per cycle over 50 cycles measured by QCM, FIG. 2.

Figure 13A:
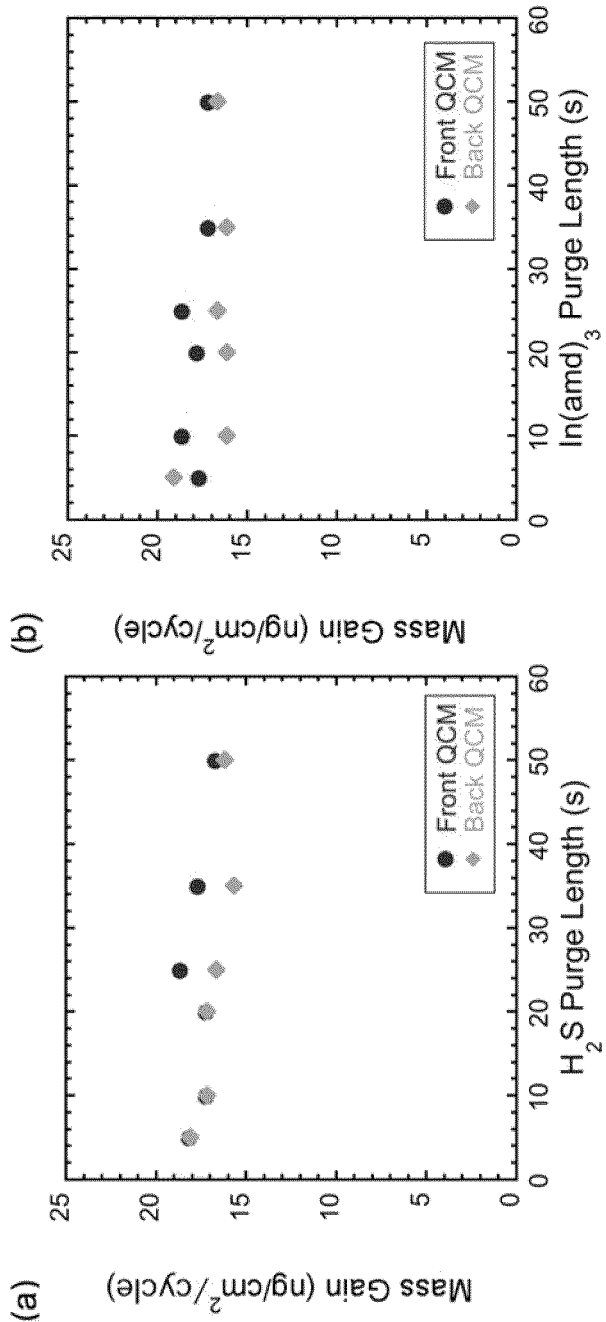
FIG. 13(a) is a graph illustrating growth rate versus purge length at 200° C. for $H_2S$ (sequence 4s/25s/0.3s/Xs).

Saturating growth behavior is observed after a ~4 s (0.15 torr*s) dose of $In(amd)_3$, with no additional growth after at least a 3× greater exposure. The half-reaction with $H_2S$ also displays a saturating reaction, in this case with a dose of less than 0.4 s (13 torr*s), likely due to the significantly larger partial pressure of the compressed $H_2S$ gas. Together these experiments demonstrate the strictly self-limiting nature of this new ALD process. Systematic variation of the wait time between each precursor pulse indicates that purge times as short as 5 s at 200° C. prevent gas-phase mixing (CVD) or reaction of physisorbed species. For purge times down to 5s the increase in growth rate is within 10% of purge times up to 50 s, FIG. 13. FIG. 13 shows the variation in growth rate with the purge time between pulses for films grown at 200° C. There is very little difference (<10%) between growth rates with purge times as long as 50 s and as short as 5 s, meaning that gas-phase mixing (CVD) and reaction with physisorbed species can be avoided even with relatively short purge times.

One hypothetical mechanism for the sequential surface reactions of $In(amd)_3$ with surface —SH groups and $H_2S$ is presented as Equations 1 and 2:

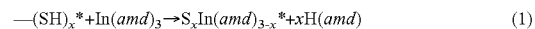

$$—(SH)_x^* + In(amd)_3 \rightarrow S_xIn(amd)_{3-x}^* + xH(amd) \qquad (1)$$

Figures 3A, 3B:
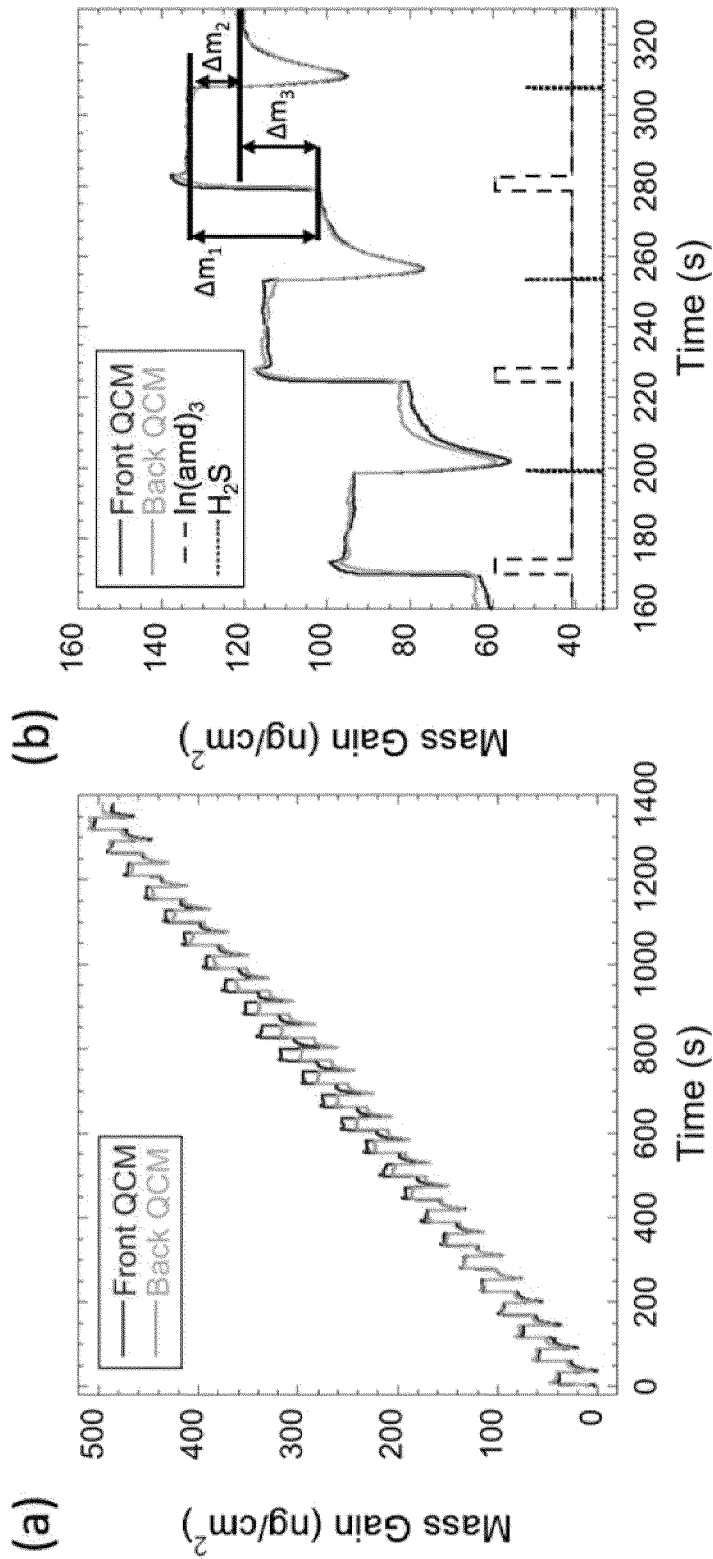
FIG. 3(a) is a graph illustrating mass deposited as function of time upon sequential dosing of $In(amd)_3$ and $H_2S$. The pulse sequence is 4-25-0.3-25.

$$S_xIn(amd)_{3-x}^* + 1.5H_2S \rightarrow S_xIn(SH)_{3-x}^* + (3-x)H(amd) \qquad (2)$$

where * denotes a surface species. The repetition of these reactions in an ABAB . . . sequence will lead to $In_2S_3$ growth in an atomic layer-by-layer fashion. Ideally, after one total ALD cycle, i.e. reaction 1 and 2, has occurred all of the amidinate ligands will have been removed, leaving no residual light elements. This statement is supported by the lack of C, N, or O impurity as deduced from ex situ analysis (see below). The variable x may then be solved for by examining the mass change in each half cycle relative to that of the overall mass change per cycle. In-situ QCM measurements at 200° C. are shown FIG. 3 using standard cycle timing.

Under these conditions, growth at both QCMs tracks very closely, yielding an overall growth rate of 19±3 ng/cycle. The details of each half-cycle (FIG. 3b) reveal a large mass gain ($\Delta m_1$) upon exposure to $In(amd)_3$. This relatively rapid and large mass gain (32±2 $ng/cm^2$) is consistent with the *facile* reaction of the In precursor and retention of a fragment that includes In. Upon exposure of this surface to $H_2S$, a transient is recorded in response to the large pressure swing and/or local heating to which the quartz crystals are also sensitive. After equilibration, a mass loss ($\Delta m_2$) of 13±2 ng is observed, consistent with replacement of the bulky amidinate ligand with a significantly lighter —SH group. By reconciling the above equations with the mass changes we conclude that the ratio of overall formula unit addition ($\Delta m_3 = InS_{1.5} = 163$) to addition of the first step ($\Delta m_i = In+(3-x)(amd)-xH = 454-114x$) should be identical to the mass change observed in FIG. 2 (19/32). Solving for x reveals that in the mechanism hypothesized on average 1.6±0.3 ligands would be lost in the first step and 1.4±0.3 upon exposure to $H_2S$.

Figure 4:
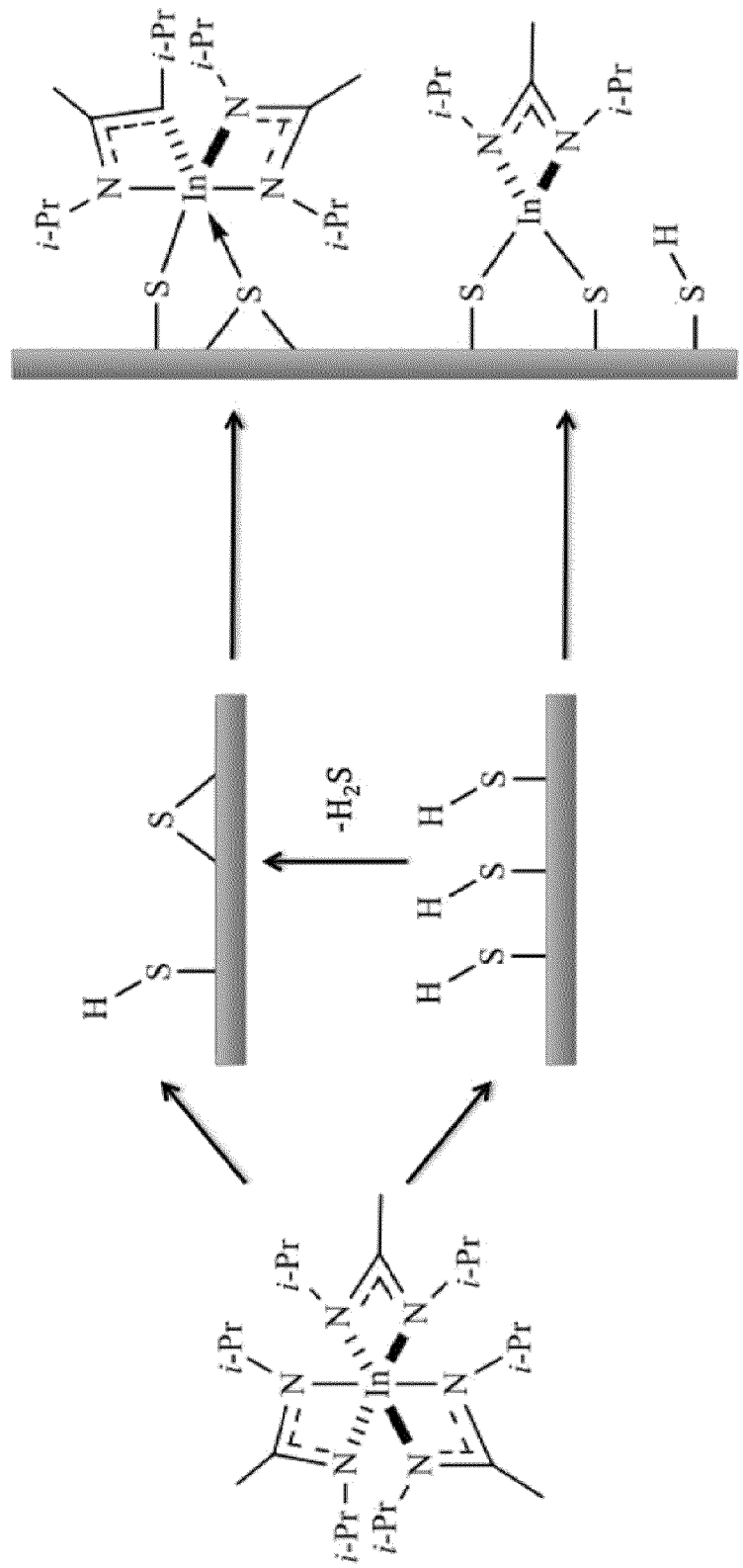
FIG. 4 illustrates an idealized schematic of $In(amd)_3$ reacting with adjacent SH/S sites and two SH sites during the $In(amd)_3$ half reaction.

A reaction scenario consistent with these results is as follows. An equilibrium distribution of surface —SH and bridging surface S groups may exist after $H_2S$ exposure. See FIG. 4. When the In complex reacts with this surface, it has the possibility of reacting with adjacent SH and S groups as well as two adjacent SH groups. The reaction with each site may produce different surface species in which either one or two ligands are lost, respectively. The subsequent $H_2S$ pulse may then remove the amidinate ligands from both species and reset the surface to its equilibrium concentration of SH and bridging S groups.

Figure 5:
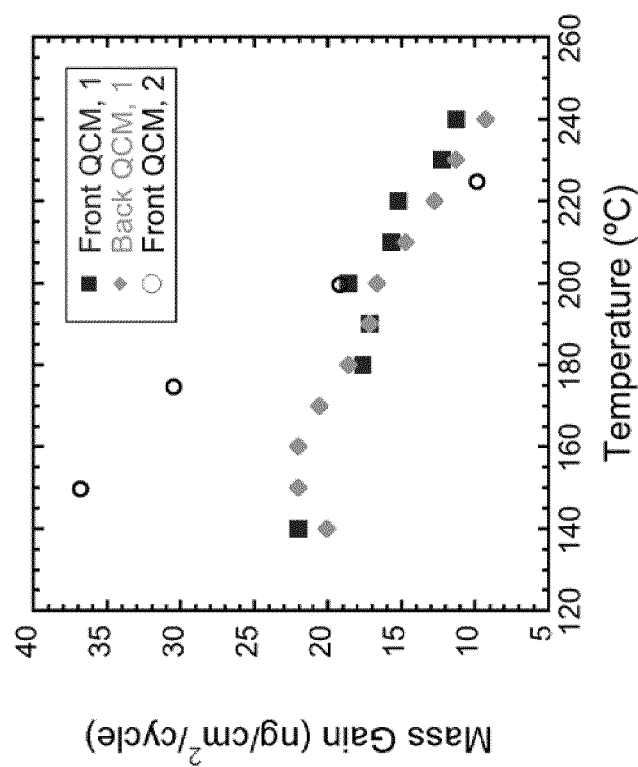
FIG. 5 is a graph illustrating the growth per cycle decreases as a function of reactor temperature. The pulse sequence for all temperatures is 4-30-0.3-30. QCM results labeled (1) are grown with 1% $H_2S$ in $N_2$, while results labeled (2) are observed when employing a more concentrated, 4% $H_2S$ in $N_2$.
Figure 6B:
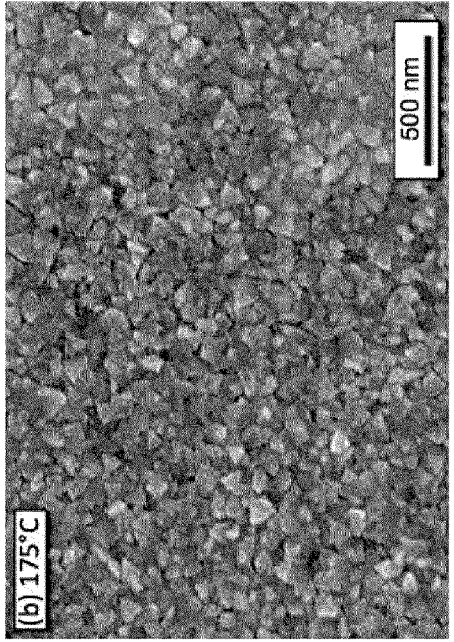
FIG. 6(b) is a SEM image at 50,000× magnification for $In_2S_3$ films grown on Si(100) at 175° C.
Figure 6D:
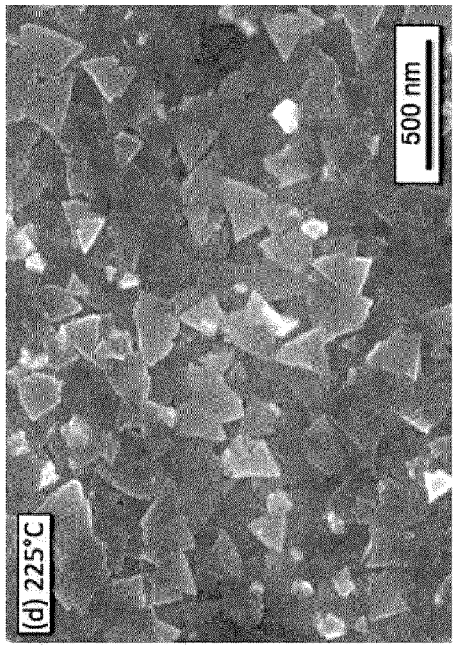
FIG. 6(d) is a SEM image at 50,000× magnification for $In_2S_3$ films grown on Si(100) at 225° C.
Figure 6A:
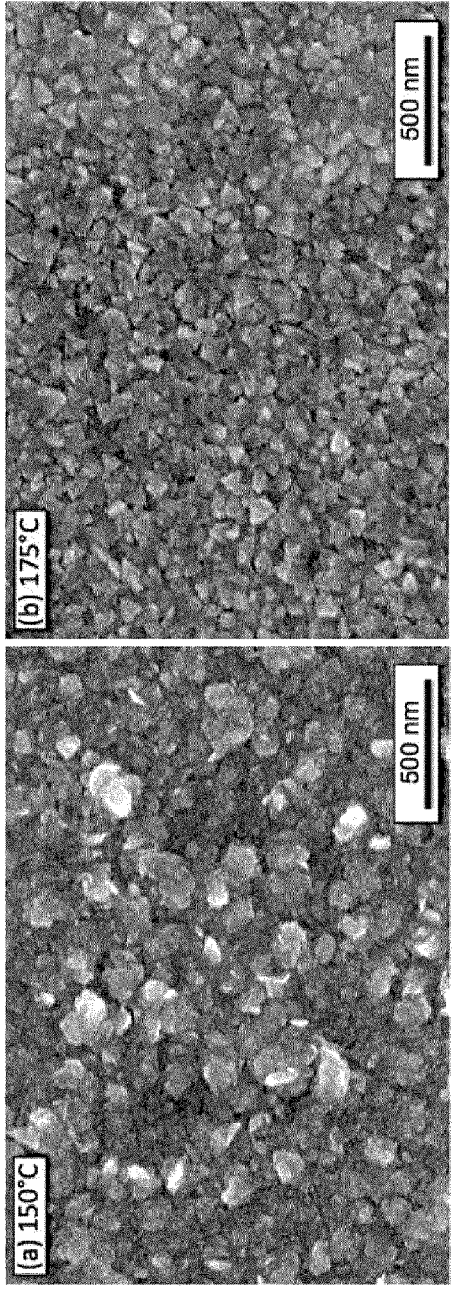
FIG. 6(a) is a SEM image at 50,000× magnification for $In_2S_3$ films grown on Si(100) at 150° C.
Figure 6C:
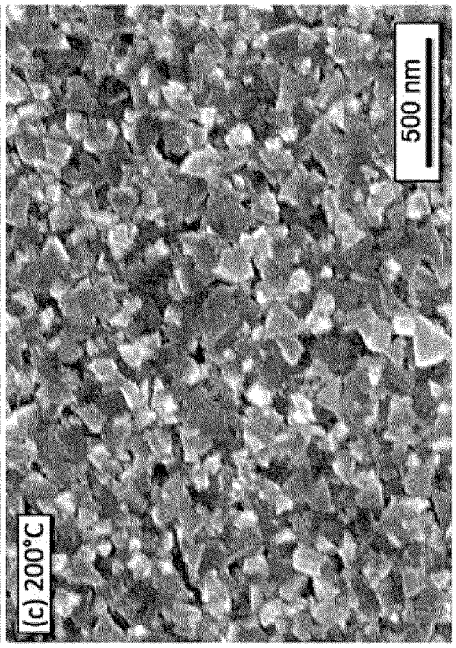
FIG. 6(c) is a SEM image at 50,000× magnification for $In_2S_3$ films grown on Si(100) at 200° C.

If this is the case, and surface SH density contributes to overall $In(amd)_3$ reaction with the surface, then the growth rate should show the large and saturating dependence on $H_2S$ concentration that is experimentally observed. See FIG. 2b. Furthermore, a significant temperature dependence to the growth might be expected as influenced by the equilibrium concentration of SH and bridging S groups at each temperature. A very similar mechanism is suggested for $GaS_x$ deposition, where the decreasing growth rate with increasing temperature is attributed to smaller —SH coverages (based on QCM data). FIG. 5 shows the effect of reactor temperature on growth rate over a range of more than 100° C.

Initially, process conditions optimized at 200° C. (see FIG. 5) are applied such that the same amount of $In(amd)_3$ and $H_2S$ is pulsed into the reactor at each temperature. An apparent growth rate plateau is observed between 140-160° C., and the rate then steadily decreases with increasing temperatures up to 240° C. (see squares and diamonds in FIG. 5). The maximum growth rate may be measured, for example, at 150° C. The observed plateau occurs because cool temperatures appear to exhibit intrinsically greater growth rates per cycle, but do not fully saturate under pulse conditions optimized at 200° C. Increasing the amount of $H_2S$ in each pulse by a factor of four (see open circles in FIG. 5) allows for full saturation, and reveals much larger growth rates at lower temperatures. The linear decrease in growth rate per cycle with increasing substrate temperature, now clearly visible, has been seen with other indium ($In(acac)_3$), zinc, gallium, and tin sulfides. In some of these systems the effect was attributed to recombinative desorption of $H_2S$ at higher temperatures (see vertical arrow in FIG. 4), thus adding further weight to the mechanism offered herein, eq. (1) and (2). In this scenario, the growth rate per cycle is reduced due to a lower density of $In(amd)_3$ binding sites as governed by the lower surface density of bridging S that result from two formerly SH site, see again FIG. 4.

Thin films were grown on fused quartz substrates for ex situ characterization according to the process conditions gleaned from the in situ studies detailed above. Dense, well adhered, and specular thin films were obtained that show the characteristic orange color of a ~2.0 band gap material. The microstructure of $In_2S_3$ films deposited at several temperatures was investigated by SEM, FIG. 6.

Figure 14:
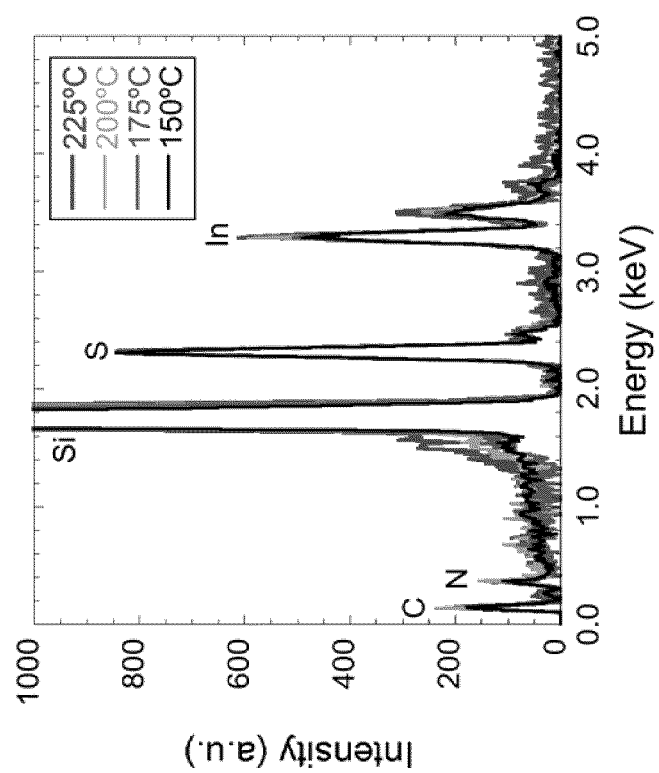
FIG. 14 is a graph illustrating energy dispersive X-ray spectroscopy analysis of $In_2S_3$ films grown on Si(100). The data is normalized at the sulfur peak.

All films appear uniform over the ~3 cm² substrate, with no sign of pinholes or cracks. Thin films deposited at 150° C. exhibit the rounded and random structure typically observed in largely amorphous materials. In contrast, growth at higher temperatures exhibits the characteristically sharp edges of polycrystalline films, with the apparent grain size increasing from ~50 to ~250 nm as the growth temperature increases from 175 to 225° C. This result differs from the reports of ALD $In_2S_3$ films grown with $In(acac)_3$ where no major increase in grain size (typically 10-25 nm) is observed, only the variation of grain size decreases with increasing temperature. EDS results for films grown at different temperatures are shown in FIG. 14. EDS data confirms the presence of both principal elements and further reveals a constant ratio of In:S for films grown between 150 and 225° C. The data is normalized to the sulfur peak, showing the In:S ratio is equivalent at all temperatures investigated. The carbon and nitrogen are best attributed to surface contaminated given the very low concentration of impurities in the bulk film found by depth profiling with RBS and with AES.

Figures 15A, 15B:
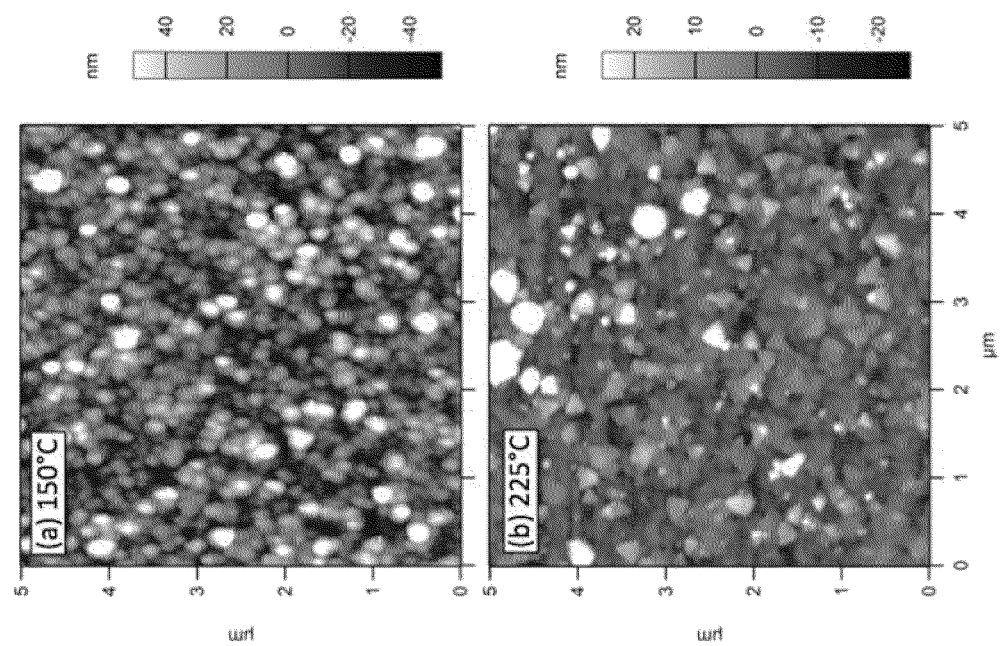
FIG. 15(a) is an atomic force microscopy image for a film grown at 150° C.
FIG. 15(b) is an atomic force microscopy image for a film grown at 225° C. The film was also annealed in nitrogen for two hours.

AFM images show similar structures for films grown on fused quartz. FIG. 15 shows atomic force microscopy images of films grown at 150° C. (FIG. 15a) and 225° C. (FIG. 15b). The film grown at 225° C. (FIG. 15b) was also annealed in a $N_2$ atmosphere at 400° C. for two hours. At 150° C., films have rounded and random features, while films grown at 225° C. have sharp edges and the same trigonal structures observed with SEM images of $In_2S_3$ on Si. The thickness and roughness for films grown at different temperatures are as follows: 150° C., 102 nm and 22.3 nm; 175° C., 98 nm and 6.7 nm; 200° C., 83 nm and 4.7 nm; and 225° C., 82 nm and 16.8 nm.

Figure 7:
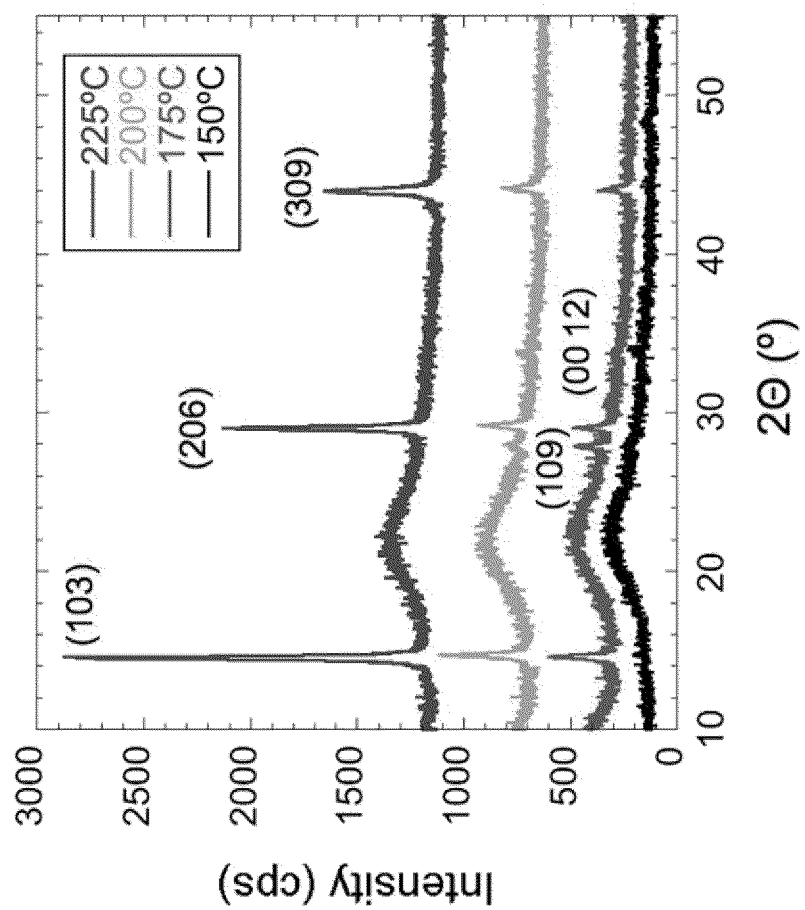
FIG. 7 is a graph illustrating x-ray diffraction from $In_2S_3$ films grown on fused quartz. Traces have been offset for clarity. The thicknesses for these films are as follows: 150° C., 102 nm; 175° C., 98 nm; 200° C., 83 nm; and 225° C., 82 nm.

The crystallinity of $In_2S_3$ films grown by the ALD process described herein was confirmed by the θ-2θ XRD scans shown in FIG. 7.

Films grown at 150° C. are largely amorphous, showing only a hint of the expected reflections with our benchtop diffractometer. Films grown at 175° C. and above show clear and sharp reflections as-deposited that may be indexed to the $\beta$-$In_2S_3$ crystal structure (JCPDS 25-0390). This tetragonal crystal structure is expected for In in the 3+ oxidation state at a growth temperature above 115° C. and has been previously observed for $In_2S_3$ deposited by ALD among other methods. Sharper peaks are observed at higher temperature, indicative of larger grain size in corroboration with SEM analysis. All crystalline thin films showed significant texture, as evidence by absent reflections. The dominance of the (103) series indicates that these crystalline planes are primarily aligned parallel to the surface. A small fraction of (109) reflections are also observed at 175 and 200° C. but are absent at 225° C.

Figure 16:
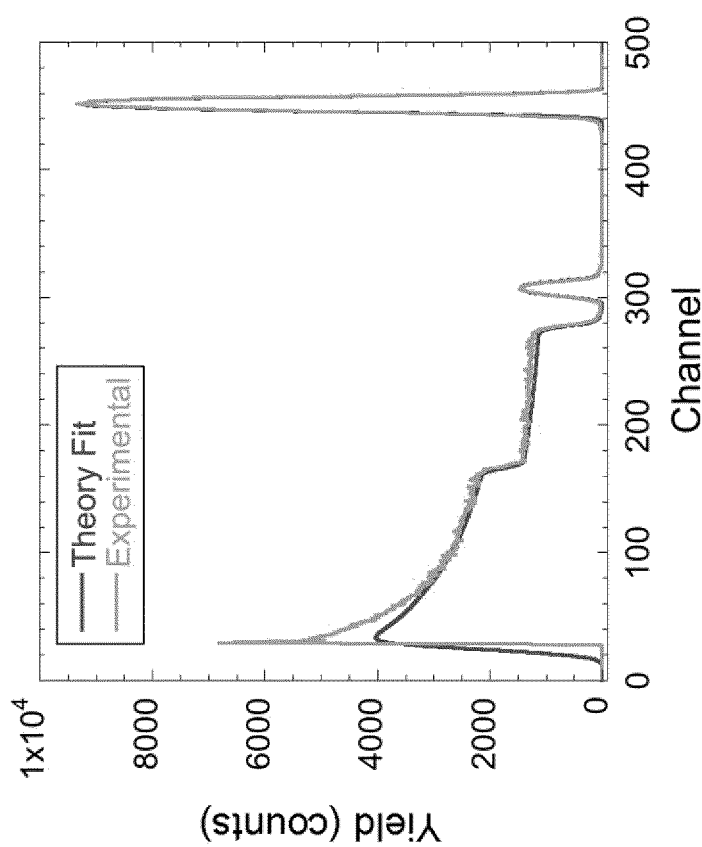
FIG. 16 is a graph illustrating RBS atomic concentrations from $In_2S_3$ grown on fused quartz at 200° C.
Figure 17:
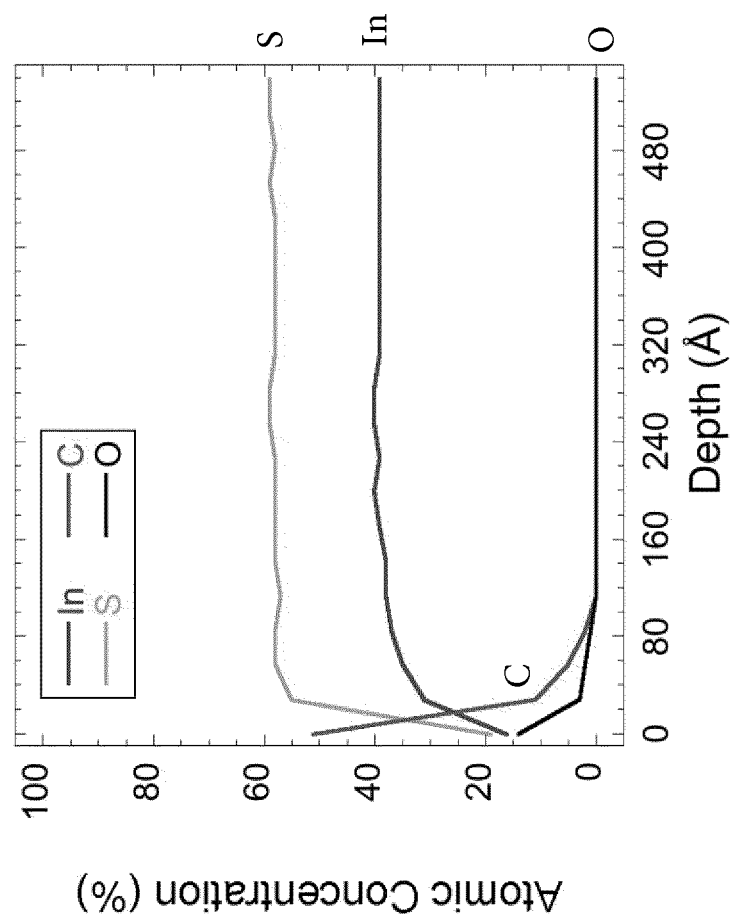
FIG. 17 is a graph illustrating a depth profile of AES atomic concentrations for $In_2S_3$ on fused quartz at 200° C.

Elemental concentrations were studied by Rutherford backscattering spectroscopy (RBS) and depth-profiling Auger electron spectroscopy (AES), (FIGS. 16 and 17, respectively). FIG. 16 shows the experimental yield and theoretical fit of RBS results for an $In_2S_3$ film grown on fused quartz at 200° C. Results indicate the presence of both indium and sulfur at atomic concentrations of 40 and 60%, respectively. These numbers are consistent throughout the bulk. Using the thickness from the XRR data, a density of 4.80 g/cm³ is calculated for this film. It is likely that an oxide layer at the surface is unaccounted for, which could explain the larger density compared to XRR. Auger Electron Spectroscopy was also performed on the same film, shown in FIG. 17. The only elements significant enough to be measured within the detection limits of the instrument were oxygen and carbon, both of which were only present as surface species. The depth of the profile was limited by charging of the quartz, disrupting clean data acquisition past 540 Å.

RBS confirms that indium and sulfur have the expected stoichiometric ratio of 40%/60%. AES showed no sign of carbon, oxygen, or nitrogen in the bulk of sulfide films down to an estimated detection limit of 1%, 0.5%, and 4%, respectively. The modest detection limit for N is due to peak overlap with the large In signal. Oxygen and carbon contamination were only present in a thin surface layer above the bulk $In_2S_3$ film as deduced by depth profiling (see FIG. 17). Glow Discharge Optical Emission Spectroscopy (GDOES) measurements show no measurable amount of Li (data not shown), which is present during $In(amd)_3$ synthesis. EDS and x-ray fluorescence (XRF) results confirm that films grown at different temperatures have the same In/S ratio and reveal no obvious impurities.

Film thickness, roughness, and density were determined for $In_2S_3$ films grown at 200° C. using x-ray reflectivity. See FIG. 8. The data is plotted as the reflected intensity (R) times $q^4$ as a function of q, where $q=4\pi \sin(\Theta)/\lambda$ and $\lambda$ is the x-ray wavelength. The $q^4$ factor compensates for the $R \propto q^{-4}$ drop in reflected intensity at q values larger than the critical angle and allows for better visualization of the relatively small Kiessig fringes that arises due to the $In_2S_3$ thin film overlayer.

The XRR fitting results are reported in Table 1.

TABLE 1

| Temperature | $\chi^2$ | t (nm) | $\sigma$ (nm) | $\rho$ (g/cm³) |
|---|---|---|---|---|
| 150° C. | 2.21 | $133_{-8}^{+6}$ | $6.5_{-0.3}^{+0.3}$ | $4.15_{-0.14}^{+0.09}$ |
| 175° C. | 1.57 | $96_{-5}^{+6}$ | $6.5_{-0.3}^{+0.4}$ | $4.47_{-0.14}^{+0.13}$ |
| 200° C. | 5.60 | $74_{-4}^{+4}$ | $7.5_{-0.4}^{+0.4}$ | $4.51_{-0.14}^{+0.14}$ |
| 225° C. | 4.82 | $57_{-1}^{+1}$ | $3.8_{-0.3}^{+0.2}$ | $4.47_{-0.09}^{+0.09}$ |

Figure 8:
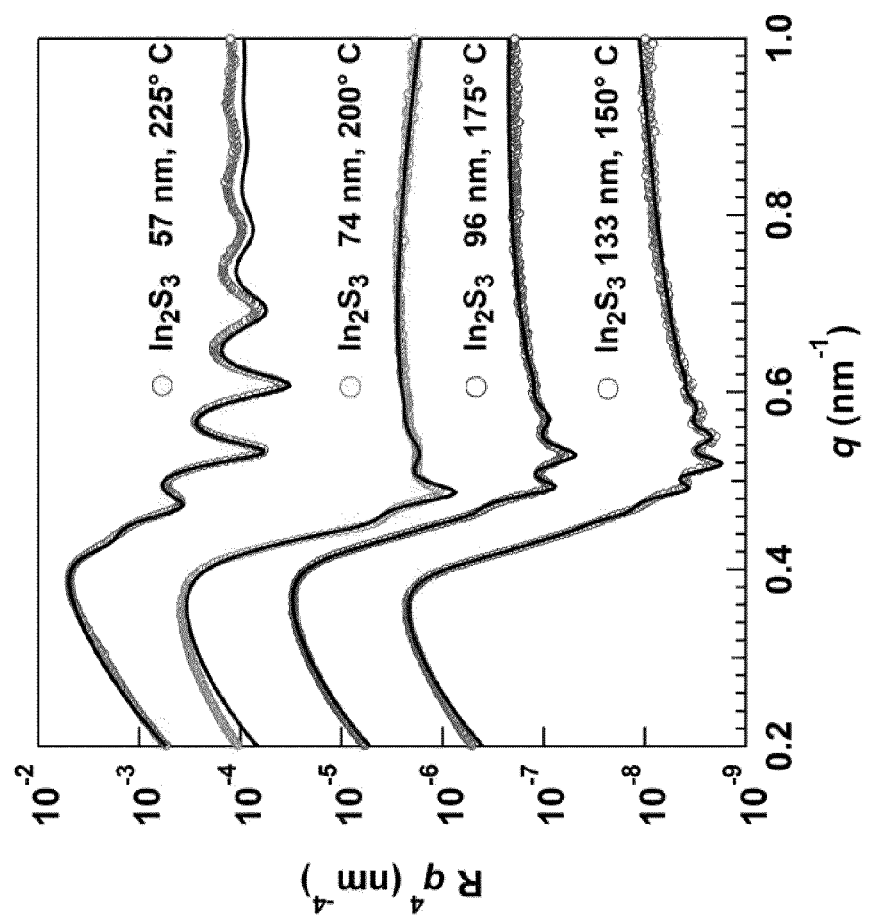
FIG. 8 is a graph illustrating X-ray reflectivity data and fits for $In_2S_3$ films grown on fused quartz at 150° C. (first line from the bottom), 175° C. (second line from the bottom), 200° C. (third line from the bottom), and 225° C. (fourth line from the bottom).

Table 1 includes XRR-derived t, a, p values acquired from fits presented in FIG. 8. $\chi^2 = (N-N_p)^{-1} \Sigma_k ((I_{meas,k} - I_{calc,k})^2 / Err_k^2)$, where $I_{meas,k}$ and $I_{calc,k}$ are the measured and calculated intensities of the $k^{th}$ data point, respectively. $Err_k$ is the uncertainty for the data point, and N and $N_p$ represent the total number of data points and fitting parameters, respectively. Error bounds define the 95% confidence interval for each parameter. Uncertainties for each result are reported with 95% confidence intervals derived from $\chi^2$ maps for each fit parameter. At the temperatures at which polycrystalline thin films are observed (FIG. 8), an $In_2S_3$ film density is, on average, slightly lower (~3%) than the bulk density of $\beta$-$In_2S_3$ (4.61 g/cm³), but consistently higher than XRR-derived densities previously reported for $In_2S_3$ ALD films (4.31 g/cm³). From this data, an average growth of 0.40 Å/cycle at 200° C. and a corresponding mass deposition rate of 19 ng/cycle at 200° C. are calculated. Thus the growth rate as derived from ex situ film studies precisely matches that measured in situ via QCM under the same process conditions (see FIGS. 3 and 4). The amorphous films grown at 150° C. have a smaller density (4.15 g/cm³), which provides a lower growth rate of 0.89 Å/cycle based on this analysis. This ample growth per cycle, the largest reported to date for halide-free $In_2S_3$ ALD, corroborates the apparently facile surface chemistry of this ALD process.

Figure 9:
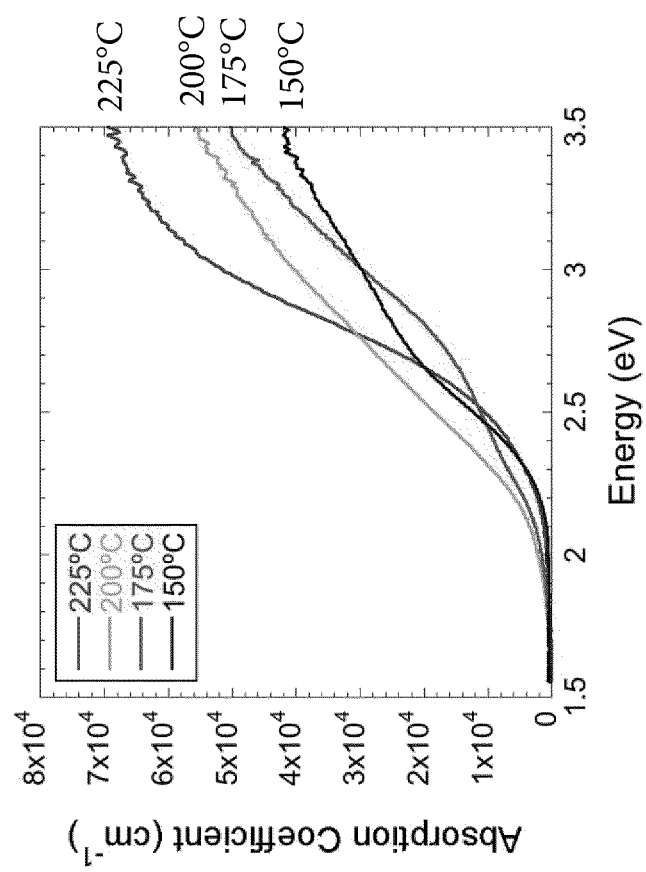
FIG. 9 is a graph illustrating absorption coefficient data for $In_2S_3$ films grown on fused quartz at 150° C., 175° C., 200° C., and 225° C. The thicknesses for these films are as follows: 150° C., 102 nm; 175° C., 98 nm; 200° C., 83 nm; and 225° C., 82 nm.

The optical absorption coefficient as a function of photon energy was obtained from reflection-corrected optical absorbance spectroscopy for several growth temperatures. See FIG. 9.

The onset of absorbance was found to be between 1.9 and 2.0 eV independent of deposition temperature. The band gap of $In_2S_3$ is notoriously difficult to characterize, with reports varying between 1.9 and 2.8 eV for $\beta$-$In_2S_3$ alone. The issue is further clouded by debate about the direct or indirect nature of the bandgap. Recent density functional theory (DFT) studies suggests that the lowest energy gap is indirect for $\beta$-$In_2S_3$, but with a slightly larger direct gap transition. The tetragonal crystal structure of $\beta$-$In_2S_3$ also has two distinct axes (a/b and c), which is predicted to lead to significant optical anisotropy near the absorption edge. Amongst these films we see evidence for all three of the DFT-calculated absorption peaks ~2.3 eV (a/b), 2.75 eV (c), and 3.0 eV (a/b)—that were also reported.

Figure 10:
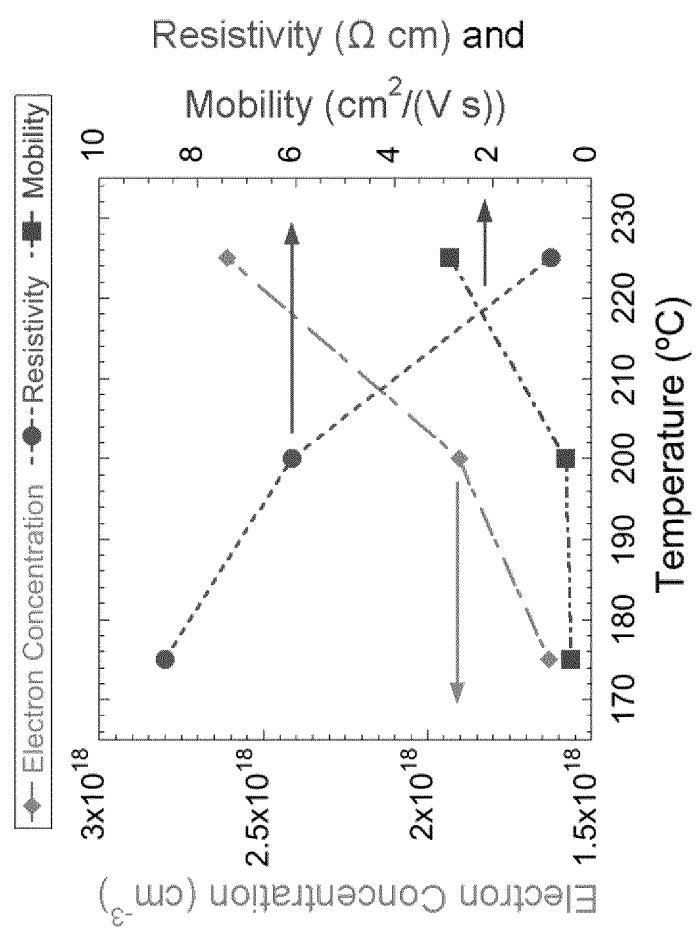
FIG. 10 is a graph illustrating $In_2S_3$ films showing n-type conductivity in proportion to the electron mobility and concentration. The thicknesses for these films are as follows: 175° C., 98 nm; 200° C., 83 nm; and 225° C., 82 nm.

The electronic properties of ALD-grown films were elucidated via Hall measurement as function of growth temperatures. See FIG. 10. All films show clear n-type conductivity as-deposited with the exception of 150° C. films, which were too resistive to quantify.

Typical mobilities hovered near 0.5 cm²/(V·s) for films grown at or below 200° C., but increase almost an order of magnitude to 3 cm²/(V·s) at 225° C. These values position ALD-grown $In_2S_3$ thin films as an interesting electronic material that compares well to $In_2S_3$ thin films grown by other methods. For undoped $In_2S_3$ films, the intrinsic donors are sulfur vacancies and indium interstitials. These electronic properties suggest that growth with $In(amd)_3$ forms more of these sites than growth with $In(acac)_3$, giving higher carrier concentrations. It is also likely in $In(acac)_3$ grown films (given their large deficiency of S) that these donor sites are reduced by oxygen incorporation in the films. The overall effect of growth temperature is an order of magnitude increase in conductivity that tracks the increasing mobility and charge carrier concentration with increasing growth temperature.

A facile and rapid atomic layer deposition process for indium sulfide was demonstrated by employing a new indium (III) amidinate precursor. The modest optimization of process conditions allows for the deposition of very low-impurity thin films over a particularly useful range of growth temperatures. A maximum growth rate of 0.89 Å/cycle was observed at 150° C. and steadily decreased to 0.22 Å/cycle at 225° C. Films grown at 175° C. or higher were shown to be largely (103) oriented $\beta$-$In_2S_3$ as deposited. Elemental analysis of the thin films reveals indium and sulfur in precise 2:3 atomic ratio and no sign of oxygen, nitrogen, carbon or halogen impurities in the bulk thin film. An optical absorbance onset revealed the expected band gap near 2.0 eV with absorption coefficients that vary slightly with film orientation. An analysis of the electronic properties as a function of growth temperature reveals mobilities in excess of 1 cm²/(V·s) that suggest potential for future electronic applications.

The method of oxygen-free atomic layer deposition of indium sulfide and the synthesis of the indium precursor described above have many potential commercial applications. For example the newly synthesized indium precursor could be used in the production of thin film PV, as cadmium poses potential health risks that can be avoided using indium sulfide in these devices. Another potential application is the use of the newly synthesized indium sulfide in mid-band gap semiconductors, as indium has sulfide has previously been unavailable with such a high purity. One of ordinary skill in the art will appreciate that newly synthesized indium sulfide is not limited to these applications.

The method of oxygen-free atomic layer deposition of indium sulfide and the synthesis of the indium precursor, as shown in the various exemplary embodiments, are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, image processing and segmentation algorithms, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present invention.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

What is claimed:

1. A method of oxygen-free atomic layer deposition of indium sulfide on an atomic layer deposition tool at temperatures ranging from 125° C. to 240° C., the method comprising:
   providing an ultra-high purity nitrogen carrier gas through the tool;
   delivering a solid In(III) N,N'-diisopropylacetamidinate precursor to the tool;
   adding a hydrogen sulfide mixture to the tool; and
   conducting at least one growth cycle, wherein one growth cycle comprises the following sequential steps:
      delivering a saturating dose of the In(III) N,N'-diisopropylacetamidinate precursor;
      purging with the ultra-high purity nitrogen carrier gas;
      delivering a saturating dose of the hydrogen sulfide mixture; and
      purging with the ultra-high purity nitrogen carrier gas.

2. The method of claim 1, wherein in the one growth cycle, the In(III) N,N'-diisopropylacetamidinate precursor dose is conducted at approximately a 0.04 Torr partial pressure.

3. The method of claim 1, wherein in the one growth cycle, the hydrogen sulfide dose is conducted at approximately a 0.45 Torr partial pressure.

4. The method of claim 1, wherein a constant stream of 10 sccm ultra-high purity nitrogen carrier gas is continuously pumped through the tool.

5. The method of claim 1, wherein the hydrogen sulfide mixture was stepped down to a pressure of 500 Torr through a two-stage regulator before flowing through a 300 µm pinhole just prior to being added to the tool.

6. The method of claim 1, further comprising repeating the growth cycle.

7. The method of claim 1, further comprising synthesizing the solid In(III) N,N'-diisopropylacetamidinate precursor that is delivered to the tool,
   wherein synthesizing the solid In(III) N,N'-diisopropylacetamidinate precursor comprises
      cooling a mixture comprised of diisopropylcarbodiimide and a first solvent to approximately −30° C.;
      adding methyllithium drop-wise into the mixture;
      allowing the mixture to warm to room temperature;
      adding indium(III) chloride as a solid to the mixture to produce a white solid;
      dissolving the white solid in a second solvent to form a clear and colorless solution; and
      evaporating the solution under reduced pressure to obtain the solid In(III) N,N'-diisopropylacetamidinate precursor.

8. The method of claim 7, wherein the first solvent is diethyl ether and the second solvent is pentane.

9. The method of claim 7, wherein synthesizing the solid In(III) N,N'-diisopropylacetamidinate precursor further comprises allowing a reaction of the mixture comprised of diisopropylcarbodiimide, diethyl ether, methyllithium and indium(III) chloride to take place overnight at room temperature prior to the step of evaporating the solution under reduced pressure to obtain the solid In(III) N,N'-diisopropylacetamidinate precursor.

10. The method of claim 7, wherein synthesizing the solid In(III) N,N'-diisopropylacetamidinate precursor further comprises removing volatiles under a reduced pressure prior to the step of evaporating the solution under reduced pressure to obtain the solid In(III) N,N'-diisopropylacetamidinate precursor.

11. The method of claim 7, wherein synthesizing the solid In(III) N,N'-diisopropylacetamidinate precursor further comprises further purifying the solid In(III) N,N'-diisopropylacetamidinate precursor by dissolving the solid In(III) N,N'-diisopropylacetamidinate precursor in pentane to form a second mixture and allowing the second mixture to cool to approximately −30° C.

12. The method of claim 7, wherein synthesizing the solid In(III) N,N'-diisopropylacetamidinate precursor further comprises purifying the solid In(III) N,N'-diisopropylacetamidinate precursor by sublimation at a temperature of approximately 150° C. and a pressure of approximately 20 mTorr.

13. The method of claim 7, wherein the mixture comprised of diisopropylcarbodiimide, the first solvent, and methyllithium is stirred for two hours prior to the step of adding indium(III) chloride.

14. The method of claim 7, wherein the step of dissolving the white solid in the second solvent comprises dissolving the white solid in pentane and filtering through a celite plug in order to form the clear and colorless solution.

* * * * *